(12) United States Patent
Kuwata

(10) Patent No.: US 7,634,035 B2
(45) Date of Patent: Dec. 15, 2009

(54) PHASE COMPARISON CIRCUIT AND CLOCK RECOVERY CIRCUIT

(75) Inventor: Naoki Kuwata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 581 days.

(21) Appl. No.: 11/089,536

(22) Filed: Mar. 25, 2005

(65) Prior Publication Data

US 2005/0220182 A1    Oct. 6, 2005

Related U.S. Application Data

(63) Continuation of application No. PCT/JP03/04118, filed on Mar. 31, 2003.

(51) Int. Cl.
H04L 7/00 (2006.01)

(52) U.S. Cl. .................... 375/371; 375/355

(58) Field of Classification Search ............. 375/355, 375/371, 375, 376
See application file for complete search history.

(56) References Cited

U.S. PATENT DOCUMENTS

| | | | |
|---|---|---|---|
| 5,490,181 A | 2/1996 | Shimotashiro et al. | |
| 5,631,590 A | 5/1997 | Tomesakai | |
| 5,790,613 A | 8/1998 | Tateishi | |
| 6,167,101 A | 12/2000 | Yang et al. | |
| 6,392,457 B1 | 5/2002 | Ransijn | |
| 7,054,402 B2 * | 5/2006 | Muellner | 375/355 |

FOREIGN PATENT DOCUMENTS

| | | |
|---|---|---|
| EP | 0 328 266 | 8/1989 |
| EP | 0 966 117 | 12/1999 |
| JP | 55-100750 | 7/1980 |
| JP | 62-114348 | 5/1987 |
| JP | 5-198101 | 8/1993 |
| JP | 8-65156 | 3/1996 |
| JP | 8-139594 | 5/1996 |
| JP | 10-4436 | 1/1998 |
| JP | 2000-243042 | 9/2000 |
| JP | 2001-339293 | 12/2001 |

OTHER PUBLICATIONS

Charles R. Hogge, Jr., "A Self Correcting Clock Recovery Circuit", IEEE Transactions on Electron Devices, vol. ED-32, No. 12, Dec. 1985, pp. 2704-2706.
Partial European Search Report and Annex dated Apr. 13, 2006 of Application No. EP 03 81 6546.
Supplementary European Search Report, mailed Jul. 3, 2007 and issued in corresponding European Patent Application No. 03816546.0-1237.

* cited by examiner

Primary Examiner—David B Lugo
(74) Attorney, Agent, or Firm—Fujitsu Patent Center

(57) ABSTRACT

A phase comparison circuit for outputting a phase difference signal indicating a phase difference between a data signal and a clock signal is disclosed. The disclosed phase comparison circuit includes: a detection part for outputting a plurality of signals indicating phases of the data signal according to different decision threshold levels; a phase comparison part for outputting phase difference signals each indicating a phase difference between a signal in the plurality of signals output from the detection part and the clock signal; and a control part for determining whether to output a particular phase difference signal in the phase difference signals by using the whole or a part of the phase deference signals.

9 Claims, 16 Drawing Sheets

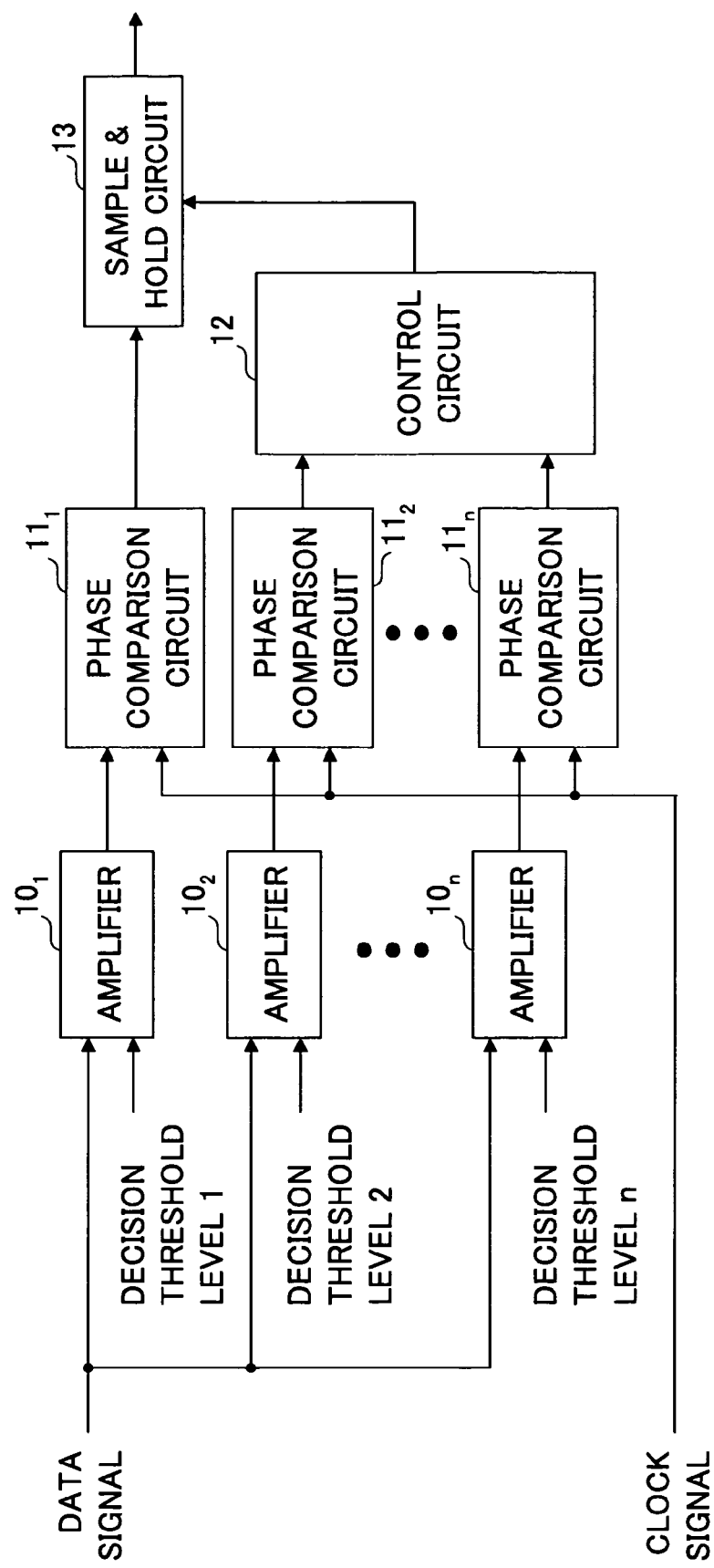

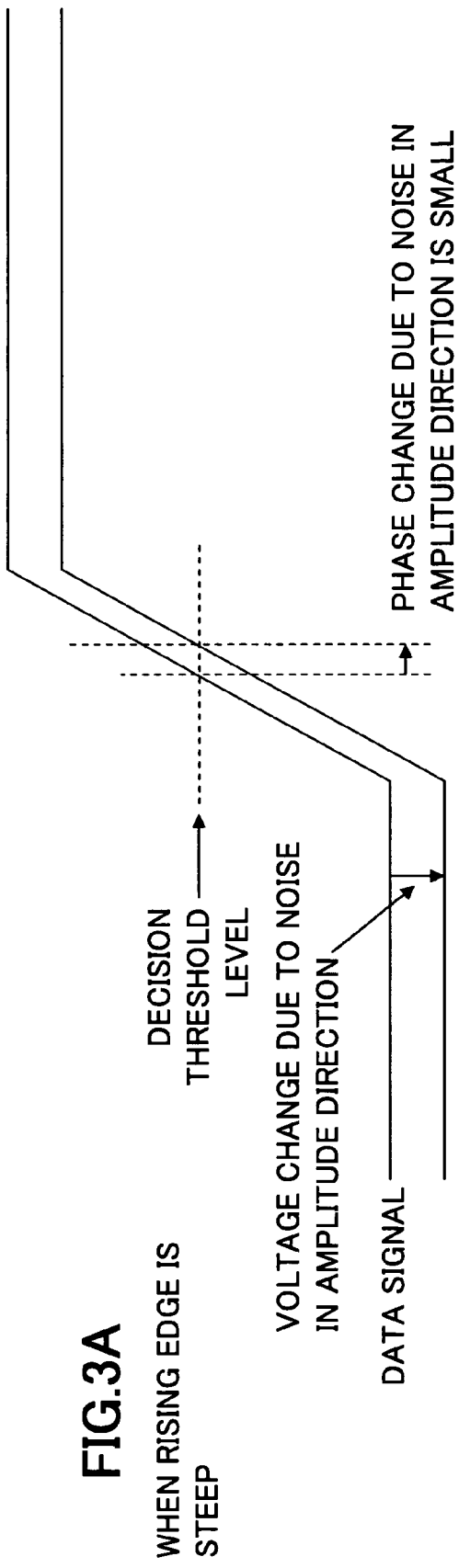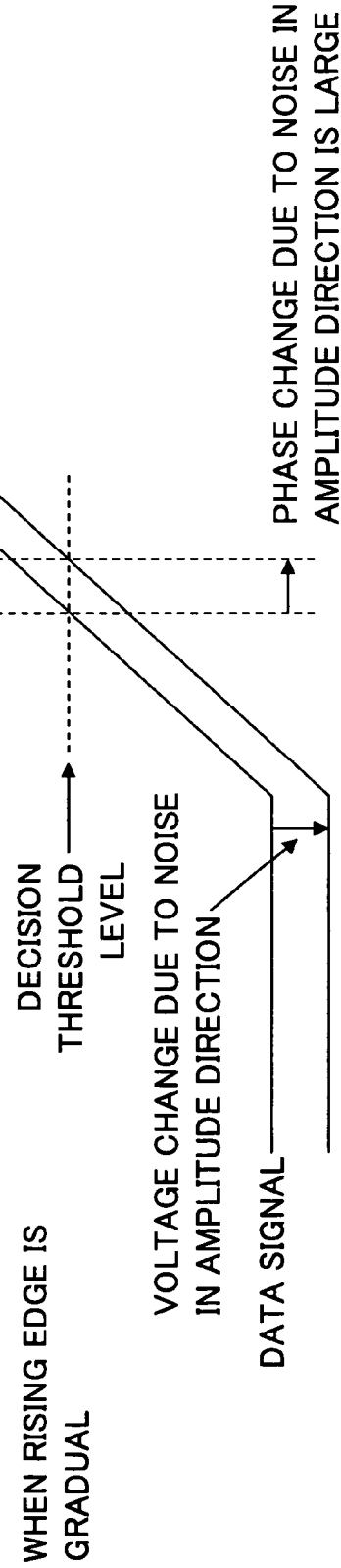

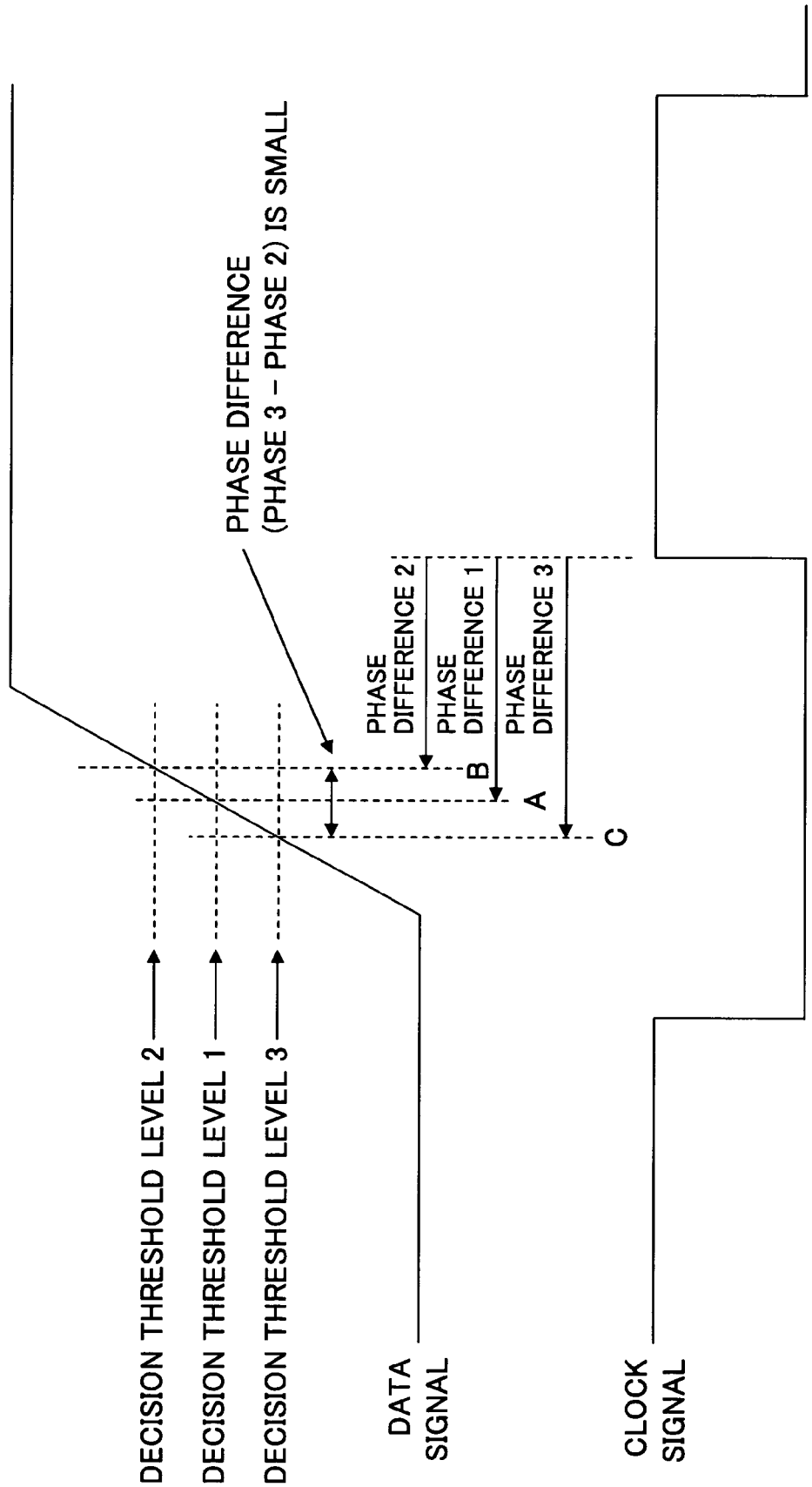

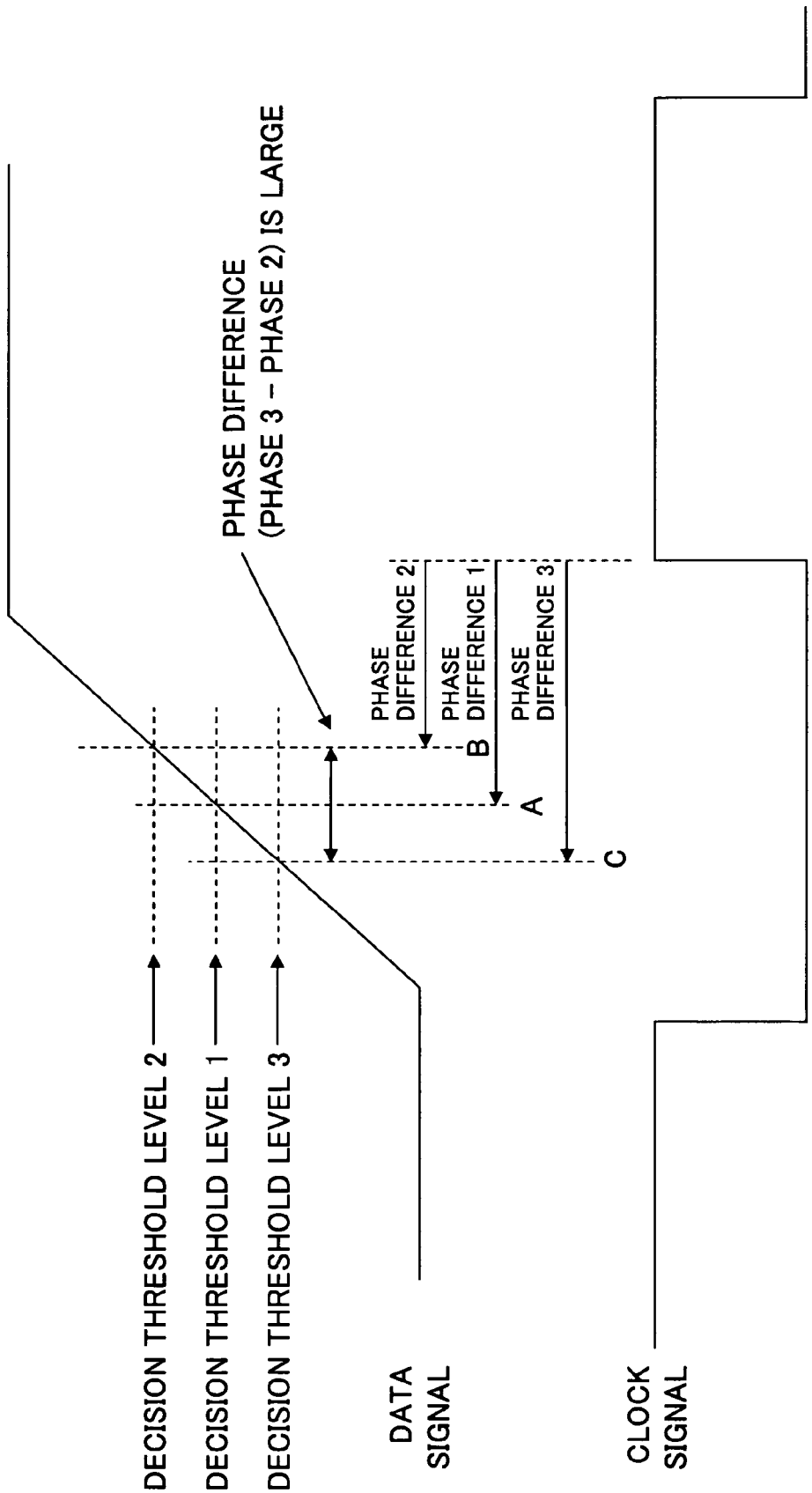

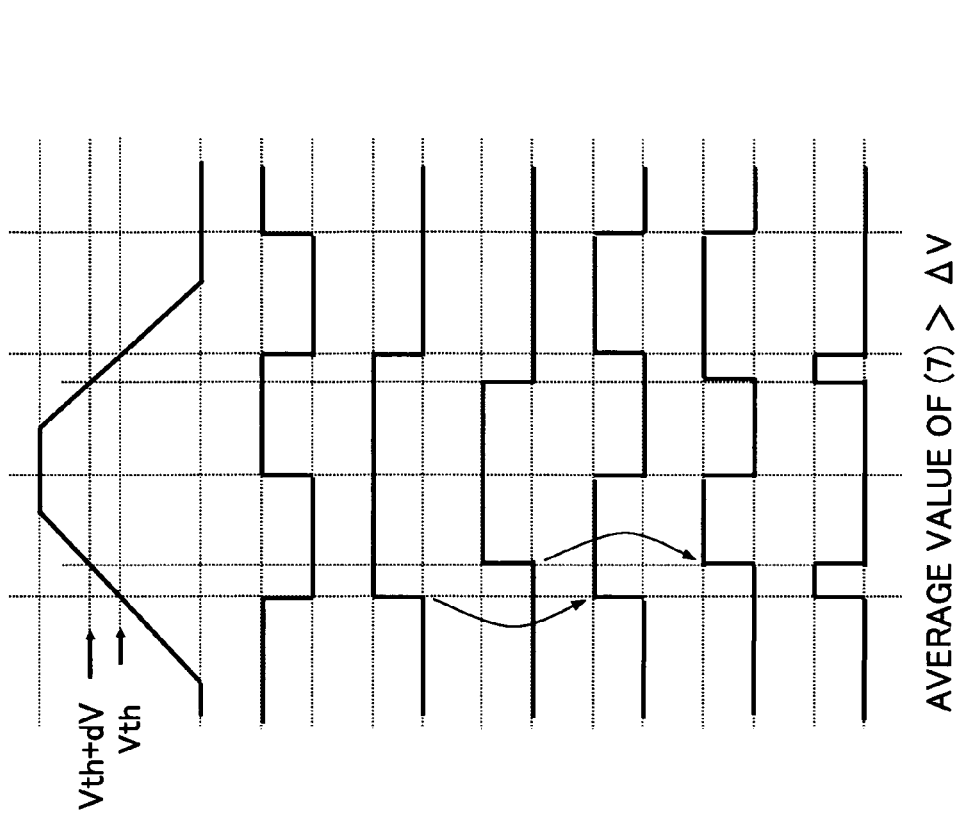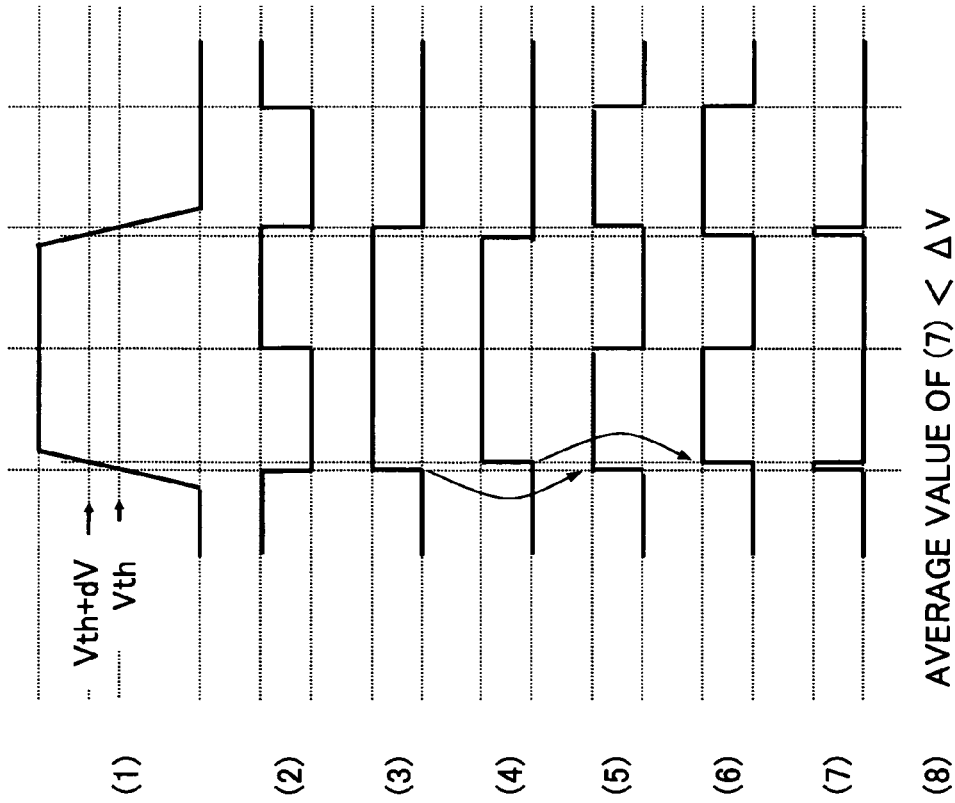

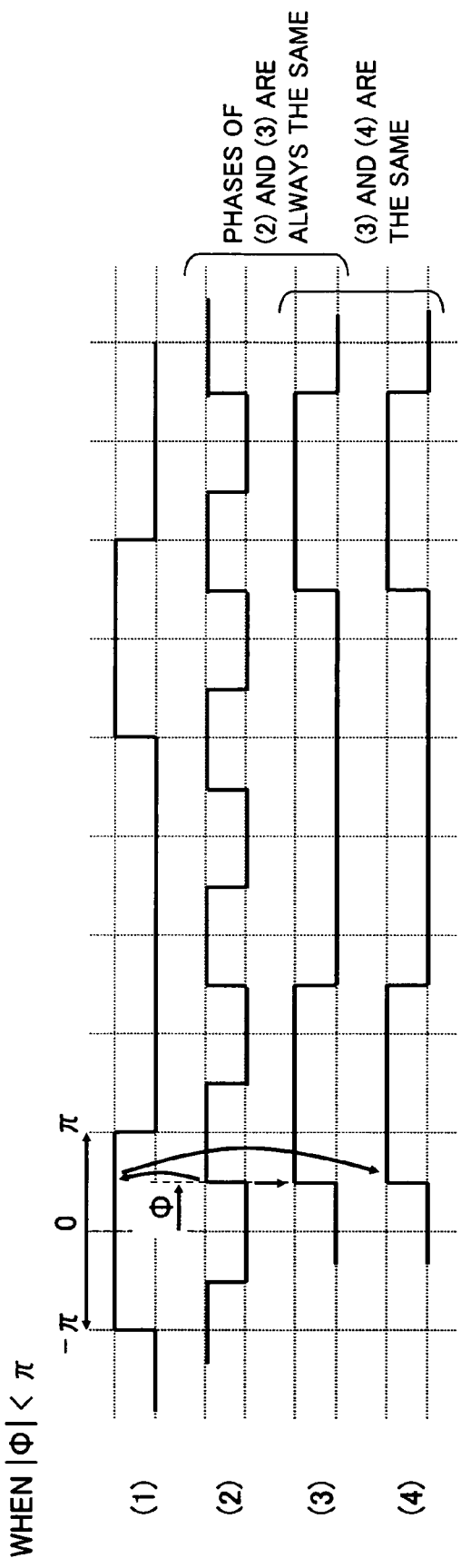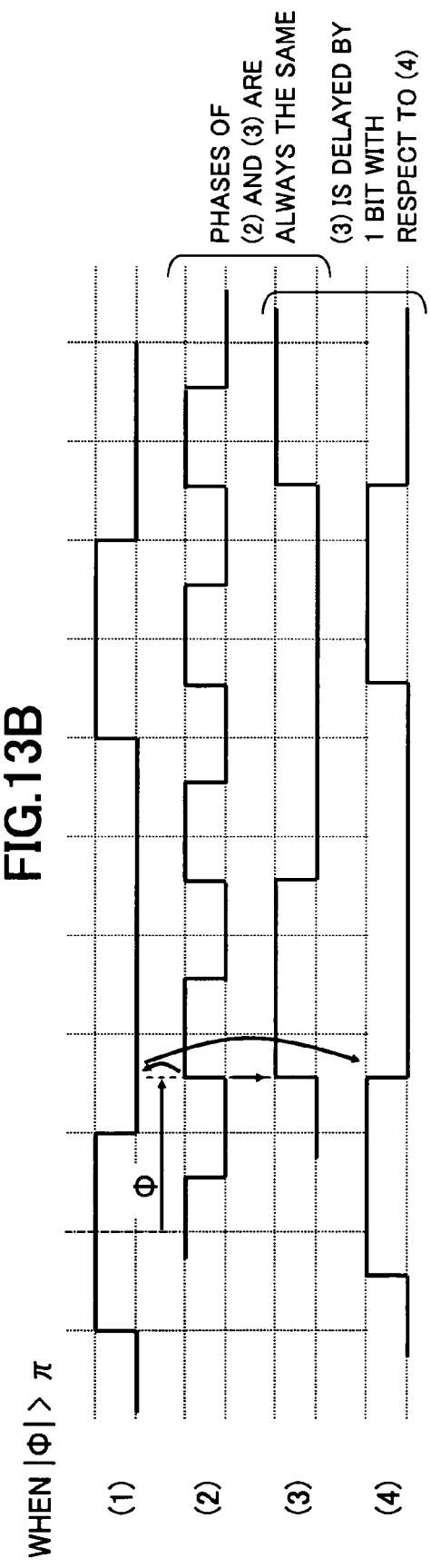

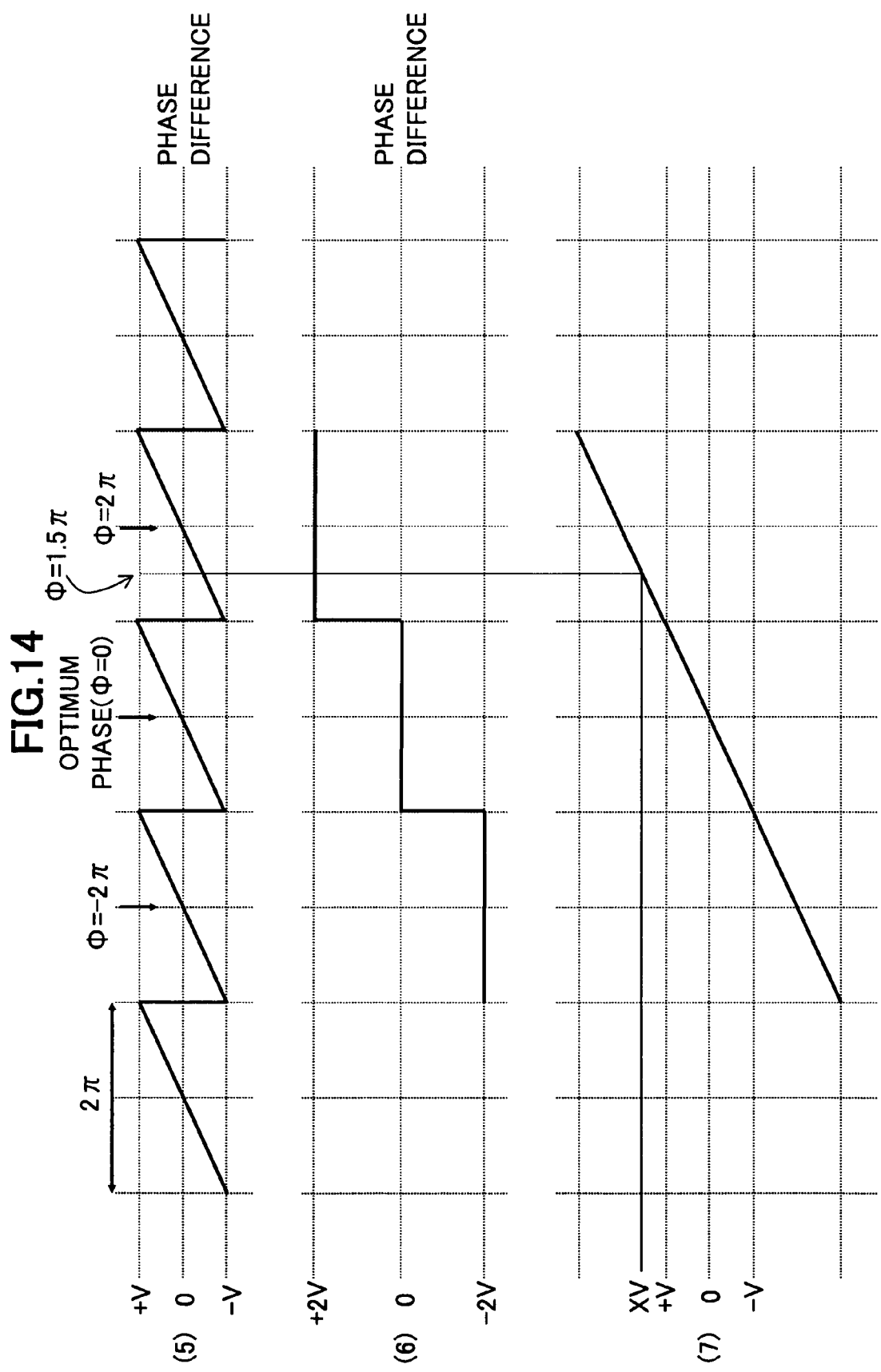

PHASE COMPARISON CIRCUIT AND CLOCK RECOVERY CIRCUIT

CROSS-REFERENCE TO RELATED APPLICATION

This application is a U.S. continuation application filed under 35 USC 111(a) claiming benefit under 35 USC 120 and 365(c) of PCT application JP03/04118, filed Mar. 31, 2003. The foregoing application is hereby incorporated by reference.

BACKGROUND OF THE INVENTION

1. Field of the Invention

The present invention relates to a clock recovery circuit and a phase comparison circuit that is used in the clock recovery circuit. More particularly, the present invention relates to the clock recovery circuit and the phase comparison circuit that can extract a phase-stable clock signal for an input data signal even when a SN (signal-to-noise) ratio of the input data signal is bad.

2. Description of the Related Art

In a conventional high-speed optical communication system, an optical receiving circuit receives a signal having a good SN ratio that does not cause any bit error in transmitted data. In recent years and continuing, high-speed optical communication systems that use error-correcting code are being developed for further increasing transmission distance and for improving transmission speed. In such systems, different from the conventional high-speed optical communication systems, there is a case where an optical receiving circuit receives a signal with a bad SN ratio that may cause a bit error. However, even when a signal output from the optical receiving circuit includes an error, the error can be corrected by a bit error correcting circuit that is connected after the optical receiving circuit, so that error free transmission can be performed.

In the optical receiving circuit, a clock recovery circuit extracts a clock signal from an input data signal so that a decision circuit identifies a data signal by using the clock signal. In the extraction of the clock signal, since there is no merit in adopting the error correcting code, it is required that the optical receiving circuit operate under a more strict environment where the SN ratio of the input signal is bad.

FIG. 1 shows a conventional configuration example of a clock recovery circuit of a PLL type and a decision circuit 2. As shown in FIG. 1, the clock recovery circuit includes a phase comparison circuit 3 that compares phases of a data signal and a clock signal so as to output a signal according to a phase difference, a loop filter 4 that smoothes the signal according to the phase difference, and a voltage control oscillator circuit 5 (VCO) that outputs a clock signal having a frequency according to an output from the loop filter 4. The clock recovery circuit 1 operates such that a phase of the clock signal is put forward (advanced) when the phase of the clock signal is delayed with respect to a phase of the data signal, and the phase of the clock signal is delayed when the phase of the clock signal is advanced with respect to the phase of the data signal.

For reducing identification error in the decision circuit 2 as much as possible, it is desirable that the phase of the output clock signal of the clock recovery circuit 1 correctly follow the phase of the input data signal according to the above-mentioned operations. When a SN ratio of the input signal is good, a phase difference between the data signal and the clock signal is correctly detected in the phase comparison circuit 3, so that the phase of the clock signal is correctly controlled such that phases of the data signal and the clock signal agree with each other.

However, when the SN ratio of the input data signal is not good, the data signal includes noise in an amplitude direction, so that the phase comparison circuit 3 detects a component of phase noise that is converted from the noise. As a result, the phase of the clock signal is controlled to an excessive degree so that problems such as increase of identifying bit errors, increase of jitter of the clock signal, and further, PLL unlock may occur.

As mentioned above, according to the conventional technology, there is a problem in that not only a phase noise component of the data signal is detected but also a noise component in the amplitude direction may be detected as phase noise. Related to this problem, there is a problem in that when a large phase difference that exceeds $\pm\pi$ occurs, a cycle slip occurs in the PLL circuit so that unlock of the PLL circuit occurs.

As for a conventional PLL circuit, when the phase difference between the data signal and the clock signal is within $\pm\pi$, the phase of the clock signal can be controlled to an optimum phase such that the phase difference becomes 0, so that synchronization of the PLL circuit can be kept, wherein $\pm\pi$ is $\pm T/2$ in time (T is one time slot, and an information unit transmitted in T is one bit). However, when a large phase difference that exceeds $\pm\pi$ occurs, the cycle slip occurs since the PLL circuit operates to control the phase of the clock signal to $\phi=\pm 2\pi$, so that the unlock of the PLL circuit occurs. This is because the phase comparison circuit 1 for comparing between the data signal and the clock signal has a periodic characteristic of each one time slot of the data signal. As prior art, technologies relating to the clock recovery circuit are disclosed in Japanese Laid-Open Patent Application No. 5-198101, Japanese Laid-Open Patent Application No. 8-139594, and Japanese Laid-Open Patent Application No. 2000-243042.

SUMMARY OF THE INVENTION

An object of the present invention is to provide a phase comparison circuit that can remove noise in the amplitude direction, which is the problem of the conventional technology. Another object of the present invention is to realize an optical receiving circuit that can extract a clock signal stably even under a condition where the SN ratio of an input data signal is bad by providing a clock recovery circuit that protects against unlock even when excessive phase noise is detected.

The above object is achieved by a phase comparison circuit for outputting a phase difference signal indicating a phase difference between a data signal and a clock signal, the phase comparison circuit including:

a detection part for outputting a plurality of signals indicating phases of the data signal according to different decision threshold levels;

a phase comparison part for outputting phase difference signals each indicating a phase difference between one of the signals output from the detection part and the clock signal; and a control part for determining whether to output a particular phase difference signal in the phase difference signals by using the whole or a part of the phase deference signals.

According to the present invention, by using the whole or a part of the phase difference signals output from the phase comparison part, a rising or falling shape of the data signal can be determined. Then, a particular phase difference signal is output when the rising edge or the falling edge is steep, so that the effect of the noise in the amplitude direction can be removed.

In addition, the above object can be achieved by a clock recovery circuit including a PLL circuit that includes a phase comparison circuit, a filter and a voltage control oscillation circuit, the clock recovery circuit including:

a signal generation circuit for detecting, by using a pattern included in an input data signal, a phase difference that exceeds ±π between the data signal and a clock signal output from the voltage control oscillation circuit, and for outputting a signal according to the phase difference; and a circuit for adding the signal generated by the signal generation circuit to an output signal from the phase comparison circuit.

According to the present invention, even when there is a phase difference that exceeds ±π, the phase of the clock signal can be controlled so as to correct the phase difference without occurrence of cycle slip.

BRIEF DESCRIPTION OF THE DRAWINGS

Other objects, features and advantages of the present invention will become more apparent from the following detailed description when read in conjunction with the accompanying drawings, in which:

FIG. 2 is a block diagram for explaining a principle of a phase comparison circuit in first to fourth embodiments;

FIGS. 3A and 3B are figures for explaining what effect is caused by noise in the amplitude direction for detecting a phase of an input data signal;

FIG. 4 is a figure for explaining a detection method for a shape of a rising edge (when the rising edge of the data signal is steep);

FIG. 5 is a figure for explaining a detection method for a shape of a rising edge (when the rising edge of the data signal is gradual);

FIGS. 11A and 11B are timing charts for explaining operations of the phase comparison circuit of the fourth embodiment;

FIGS. 13A and 13B are timing charts for explaining an operation of the clock recovery circuit of the fourth embodiment;

FIG. 14 is a figure showing characteristics of each signal;

DETAILED DESCRIPTION OF THE PREFERRED EMBODIMENTS

In the following, embodiments of the present invention are described with reference to figures. First to fourth embodiments are embodiments of a phase comparison circuit in a clock recovery circuit that can remove noise in the amplitude direction. A fifth embodiment is an embodiment of a clock recovery circuit, and a sixth embodiment is an embodiment of an optical communication system that uses the above-mentioned phase comparison circuit and clock recovery circuit.

Figure 1:
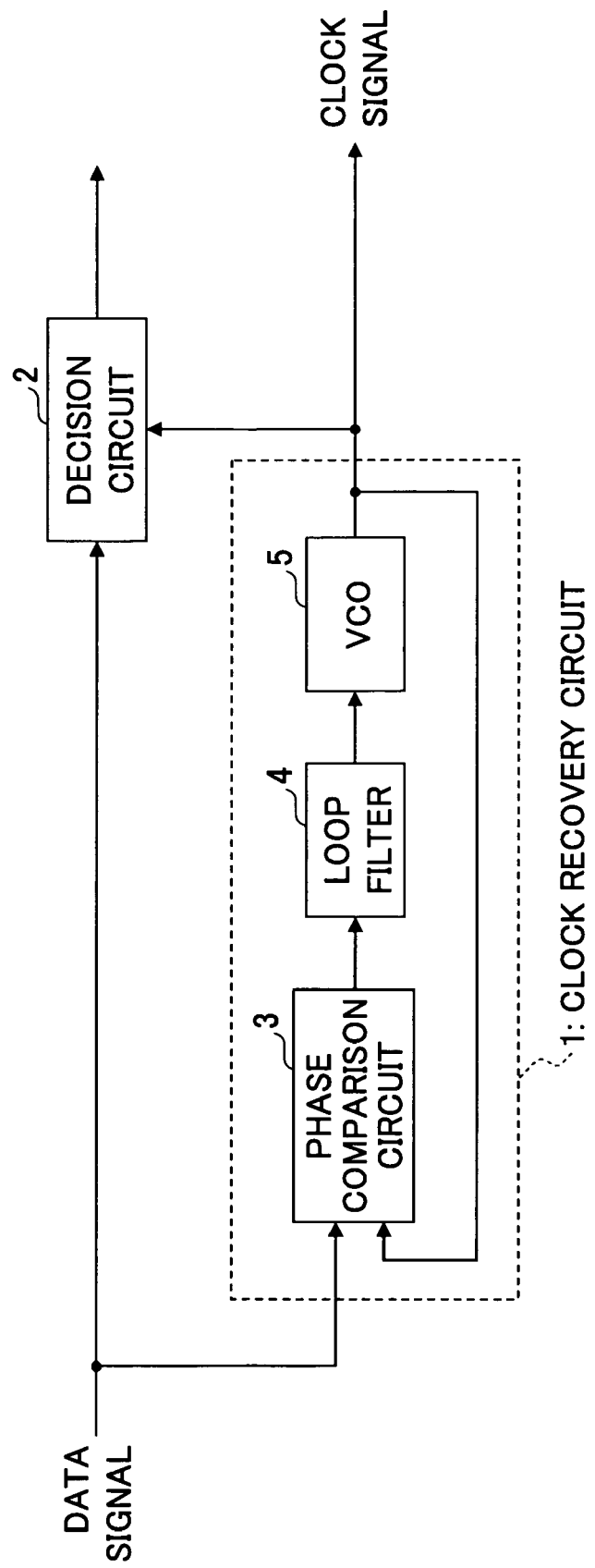
FIG. 1 is a block diagram of an a conventional clock recovery circuit using a PLL circuit, and a decision circuit.

First, a principle of the first to fourth embodiments is described. FIG. 2 shows a block diagram of the phase comparison circuit for explaining the principle. The phase comparison circuit is one that may be used as the phase comparison circuit 3 in the clock recovery circuit shown in FIG. 1.

The phase comparison circuit shown in FIG. 2 includes plural amplifiers $10_1 \sim 10_n$, phase comparison circuits $11_1 \sim 11_n$, a control circuit 12, and a sample-and-hold circuit 13. Each of the phase comparison circuits $11_1 \sim 11_n$ compares phases between a signal of an amplifier and a clock signal, and outputs a signal indicating a phase difference. The operation of the phase comparison circuit shown in FIG. 2 is described as follows.

An input data signal is divided into plural data signals, and the amplifiers $10_1 \sim 10_n$ receive the data signals. Each of the amplifiers $10_1 \sim 10_n$ has a different decision threshold level (1~n). It can be considered that an amplified data signal identified with a corresponding decision threshold level has phase information at a time when the data signal cuts across the decision threshold level. Each amplifier $10_1 \sim 10_n$ outputs a signal having a corresponding phase. Each phase comparison circuit $11_1 \sim 11_n$ detects a phase difference of a signal output from a corresponding amplifier, so that shapes of rising and falling edges of the data signal can be detected. That is, whether the slope is large or small, more particularly, whether a time of voltage change of the data signal is long or short can be detected according to a width between predetermined decision threshold levels. Then, the control circuit 12 determines effect of noise in the amplitude direction from the shape of the edge. When the effect of noise is large, the control circuit 12 does not cause the sample-and-hold circuit 13 to output a phase difference signal that is received from the phase comparison circuit $11_1$. When the effect of noise is small, the control circuit 12 causes the sample-and-hold circuit 13 to output a phase difference signal input from the phase comparison circuit $11_1$.

The operation principle is described with reference to FIGS. 3A-5. In each of these figures, a case where three amplifiers exist is described.

FIGS. 3A and 3B are for explaining how the noise in the amplitude direction affects a detected phase of an input data signal. FIG. 3A shows a case where the rising edge of the data signal is steep, and FIG. 3B shows a case where the rising edge of the data signal is gradual. As mentioned above, a phase of a data signal is detected as a phase at the time when the data signal cuts across a decision threshold level.

As shown in each of FIGS. 3A and 3B, even though a phase of a data signal is actually not changed, when there is noise in the amplitude direction, the phase is changed with respect to a phase that is detected when there is no noise. As shown in FIGS. 3A and 3B, it appears that the gradualer the rising edge is, the more the phase changes due to noise in the amplitude direction.

As mentioned above, the effect of the noise in the amplitude direction is large when the rising edge is gradual. Therefore, in the configuration shown in FIG. 2, the phase comparison circuit of FIG. 2 detects whether the rising edge of the data signal is steep or gradual. A signal that indicates a phase difference between the data signal and the clock signal and that is detected when the rising edge is gradual is not used as an input to a VCO. Instead, a signal that that indicates a phase difference and that is detected when the rising edge is steep is used as an input to the VCO. Accordingly, the effect of the noise in the amplitude direction can be decreased. The phase comparison circuit shown in FIG. 2 is configured based on such principle.

Next, how the phase comparison circuit shown in FIG. 2 detects whether the rising edge of the data signal is gradual or steep is described.

FIG. 4 shows an example where the rising edge of the data signal is steep, and FIG. 5 shows an example where the rising edge of the data signal is gradual. As shown in each of FIGS. 4 and 5, a phase when the data signal goes across the decision threshold level 1 is "A", a phase when the data signal goes across the decision threshold level 2 is "B", and a phase when the data signal goes across the decision threshold level 3 is "C". A phase difference between "A" at the decision threshold level 1 and the clock signal is indicated as "phase difference 1", a phase difference between "B" at the decision threshold level 2 and the clock signal is indicated as "phase difference 2", and a phase difference between "C" at the decision threshold level 3 and the clock signal is indicated as "phase difference 3".

As understood by comparing FIG. 4 and FIG. 5, a difference between the phase difference 3 and the phase difference 2 is larger in FIG. 5 than the difference in FIG. 4. This is because the rising edge of the data signal is gradualer in FIG. 5 than FIG. 4.

As mentioned above, by detecting the phase differences between a phase of the data signal at different decision threshold levels and a phase of the clock signal, and by obtaining a difference between the phase differences, it can be determined whether the rising edge is gradual or steep. In a case where the examples of FIGS. 4 and 5 are applied to the circuit of FIG. 2, signals of the phase difference 2 and the phase difference 3 are input to the control circuit 12. When a difference between the phase difference 2 and the phase difference 3 is larger than a predetermined reference value, the sample-and-hold circuit 13 does not output a signal of the phase difference 1. When the difference is smaller than the reference value, the sample-and-hold circuit 13 outputs the signal of the phase difference 1.

Although each of the examples of FIGS. 4 and 5 corresponds to a case where three amplifiers and three phase comparison circuits are used in the phase comparison circuit in FIG. 2, by increasing the number of the amplifiers and the phase comparison circuits, the edge shape can be detected more accurately.

First Embodiment

Figure 6:
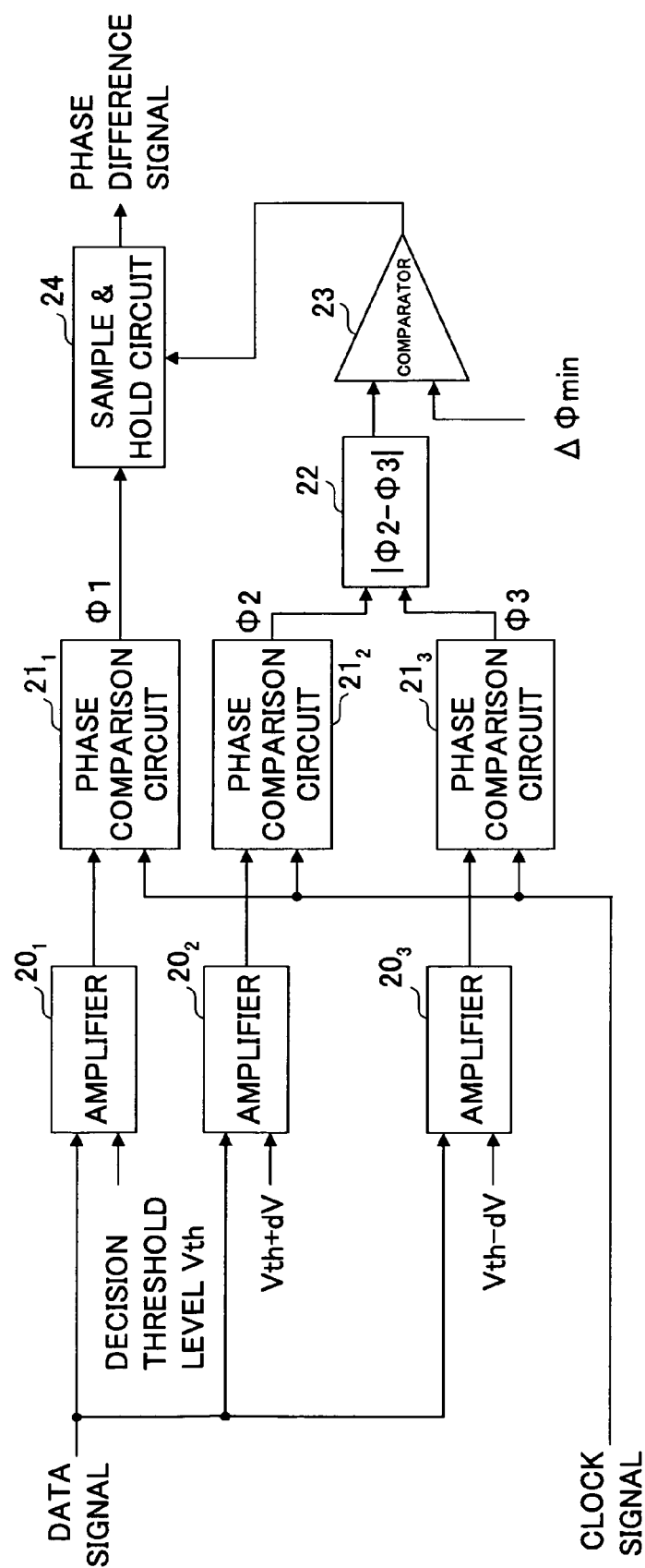
FIG. 6 is a block diagram of a phase comparison circuit in a first embodiment.

A first embodiment based on the above-mentioned principle is described. FIG. 6 shows a configuration of a phase comparison circuit in the first embodiment.

The phase comparison circuit in the first embodiment includes amplifiers $20_1$~$20_3$, phase comparison circuits $21_1$~$21_3$ each for comparing phases of a signal from a corresponding amplifier and the clock signal, a circuit 22 for calculating a difference between a phase difference $\phi 2$ from the phase comparison circuit $21_1$ and a phase difference $\phi 3$ from the phase comparison circuit $21_3$, a comparator 23 for comparing a reference value $\Delta\phi$ min with an output value from the circuit 22, and a sample-and-hold circuit 24 for holding and outputting a signal from the phase comparison circuit $21_1$. The circuit 22 and the comparator 23 correspond to the control circuit 12.

As shown in the figure, a decision threshold level Vth is supplied to the amplifier $20_1$, a decision threshold level Vth+dV is supplied to the amplifier $20_2$, and a decision threshold level Vth-dV is supplied to the amplifier $20_3$. Each phase comparison circuit compares a phase of the data signal detected by using a corresponding decision threshold level with a phase of the clock signal. The comparator 23 compares a difference between the output $\phi 2$ of the phase comparator circuit $21_2$ and the output $\phi 3$ of the phase comparator circuit $21_3$ with $\Delta\phi$ min. When the difference is less than or equal to $\Delta\phi$ min, the sample-and-hold circuit 24 is instructed to output the output $\phi 1$ of the phase comparison circuit $21_1$. When the difference is greater than $\Delta\phi$ min, the sample-and-hold circuit 24 is instructed to hold $\phi 1$. Accordingly, the effect of the noise in the amplitude direction can be decreased.

Second Embodiment

Figure 7:
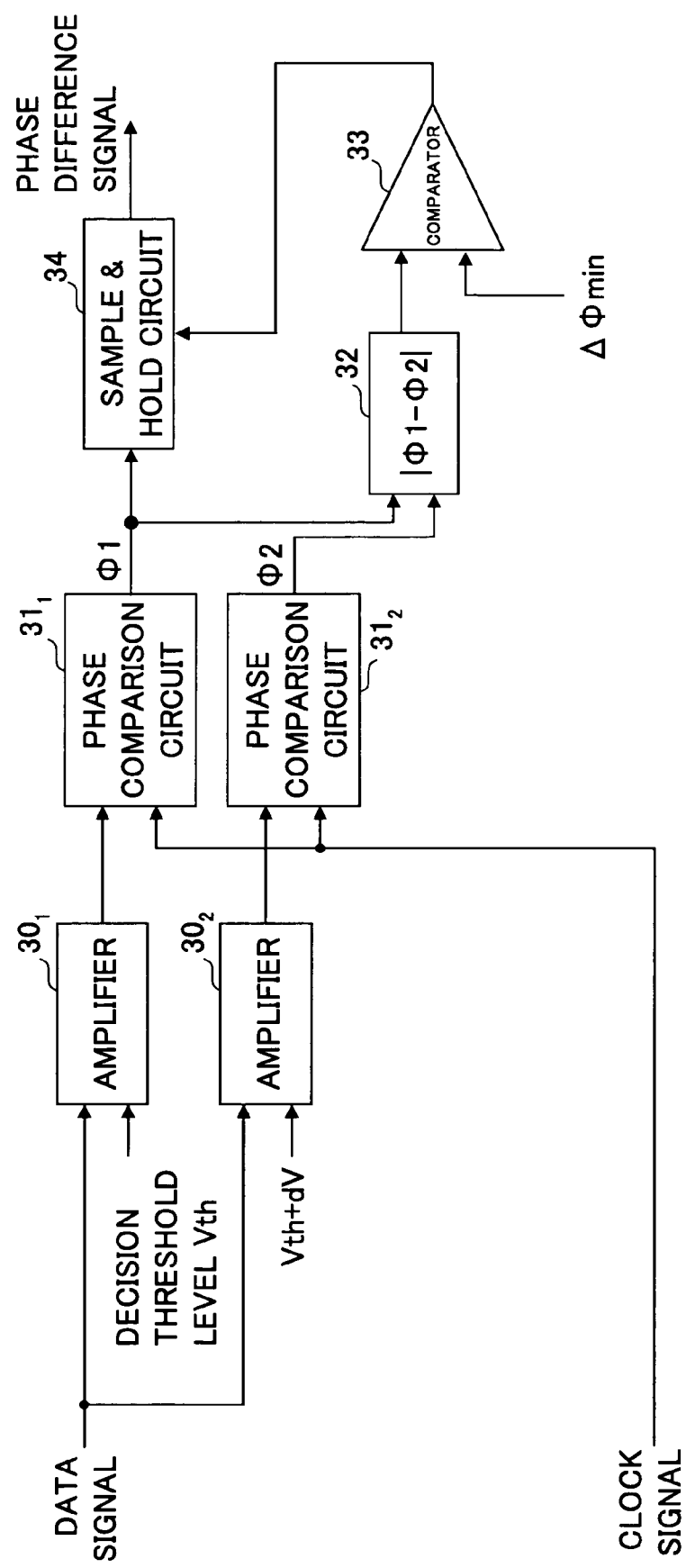
FIG. 7 is a block diagram of a phase comparison circuit in a second embodiment.

Next, a second embodiment is described. FIG. 7 shows a configuration of a phase comparison circuit in the second embodiment.

The phase comparison circuit in the second embodiment includes amplifiers $30_1$~$30_2$, phase comparison circuits $31_1$~$31_2$ each for comparing phases of a signal from an amplifier and the clock signal, a circuit 32 for calculating a difference between a phase difference $\phi 1$ from the phase comparison circuit $31_1$ and a phase difference $\phi 2$ from the phase comparison circuit $31_2$, a comparator 33 for comparing a reference value $\Delta\phi$ min with an output value from the circuit 32, and a sample-and-hold circuit 34 for holding and outputting a signal from the phase comparison circuit $31_1$. The circuit 32 and the comparator 33 correspond to the control circuit 12 of FIG. 2.

As shown in the figure, a decision threshold level Vth is supplied to the amplifier $30_1$, and a decision threshold level Vth+dV is supplied to the amplifier $30_2$. Each phase comparison circuit compares a phase of the data signal detected by using the decision threshold level with a phase of the clock signal. The comparator 32 compares a difference between the output $\phi 1$ of the phase comparator circuit $31_1$ and the output $\phi 2$ of the phase comparator circuit $31_2$ with $\Delta\phi$ min. When the difference is less than or equal to $\Delta\phi$ min, the sample-and-hold circuit 34 is instructed to output the output $\phi 1$ of the phase comparison circuit $31_1$. When the difference is greater than $\Delta\phi$ min, the sample-and-hold circuit 34 is instructed to hold $\phi 1$.

Different from the first embodiment, two pairs of amplitude and phase comparison circuits are used in the second embodiment. Also by using such configuration, the effect of the noise in the amplitude direction can be decreased based on the principle described above.

Third Embodiment

Figure 8:
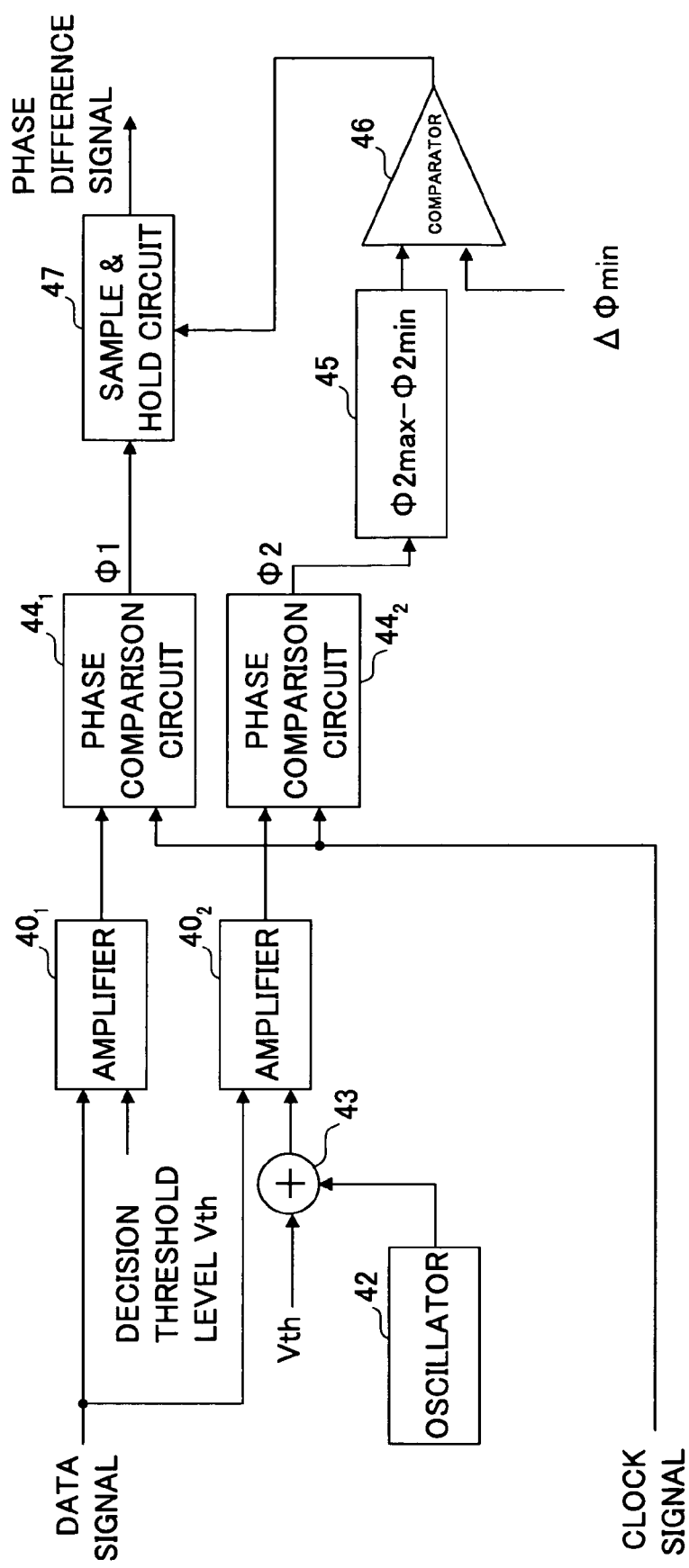
FIG. 8 is a block diagram of a phase comparison circuit in a third embodiment.

Next, a third embodiment is described. FIG. 8 shows a configuration of a phase comparison circuit in the third embodiment.

The phase comparison circuit in the third embodiment includes amplifiers $40_1$~$40_2$, an oscillator 42 for periodically changing a decision threshold level of the amplifier $40_2$, an adder 43 for adding a signal of the oscillator 42 and a signal indicating the decision threshold level, phase comparison circuits $44_1 \sim 44_2$ each for comparing phases of a signal from an amplifier and the clock signal, a circuit 45 for calculating a difference between a maximum value and a minimum value of an output $\phi 2$ from the phase comparison circuit $44_2$, a comparator 46 for comparing a reference value $\Delta\phi$ min with an output value from the circuit 45, and a sample-and-hold circuit 47 for holding and outputting a signal from the phase comparison circuit $44_1$. The circuit 45 and the comparator 46 correspond to the control circuit 12 of FIG. 2.

As shown in the figure, a decision threshold level Vth is supplied to the amplifier $40_1$, and a decision threshold level that periodically changes from Vth as a center is supplied to the amplifier $40_2$. Therefore, a value of the phase difference output from the phase comparison circuit $44_2$ changes according to the decision threshold level. Accordingly, since it becomes possible to obtain plural phase differences corresponding to different decision threshold levels, the effect the same as that in first and second embodiments can be obtained. The circuit 45 obtains the difference between the maximum value and the minimum value of the phase differences, and the comparator 46 compares the difference with $\Delta\phi$ min. When the difference is less than or equal to $\Delta\phi$ min, the comparator 46 instructs the sample-and-hold circuit 47 to output $\phi 1$ of the phase comparison circuit $44_1$. When the difference is greater than $\Delta\phi$ min, the comparator 46 instructs the sample-and-hold circuit 47 to hold $\phi 1$ output from the phase comparison circuit $44_1$. In addition to obtaining the difference between the maximum value and the minimum value of the phase differences, the circuit 45 may obtain a difference between phase differences obtained at two predetermined timings in the oscillator 42.

Fourth Embodiment

Figure 9:
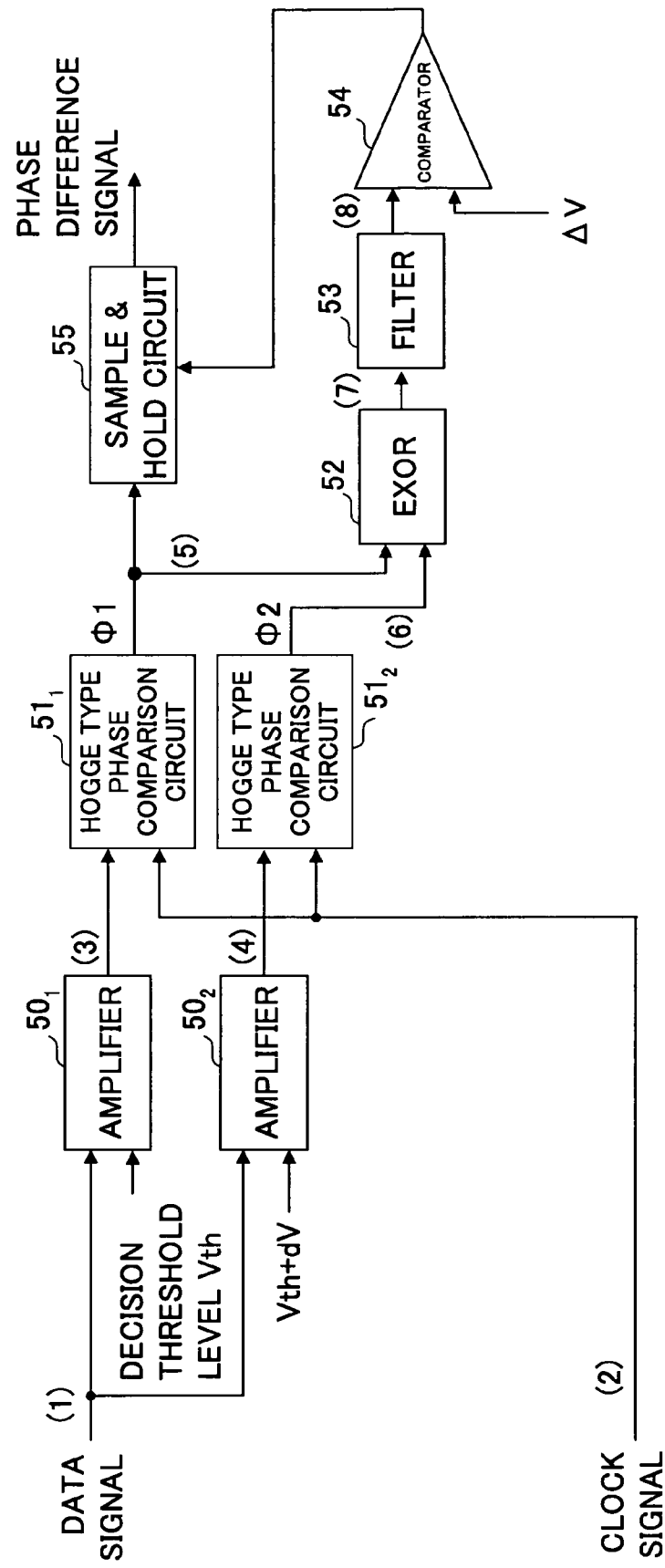
FIG. 9 is a block diagram of a phase comparison circuit in a fourth embodiment.

Next, a fourth embodiment is described. FIG. 9 shows a configuration of a phase comparison circuit in the fourth embodiment.

The phase comparison circuit in the fourth embodiment includes amplifiers $50_1 \sim 50_2$, Hogge type phase comparison circuits $51_1 \sim 51_2$ each for comparing phases of a signal from an amplifier and the clock signal, an XOR circuit 52 for performing exclusive-OR (XOR) calculation on outputs $\phi 1$ and $\phi 2$ from the Hogge type phase comparison circuits $51_1 \sim 51_2$, a filter 53 for calculating an average of output values of the XOR circuit 52, a comparator 54 for comparing a reference value $\Delta\phi$ min with an output value from the filter 53, and a sample-and-hold circuit 55 for holding and outputting a signal from the phase comparison circuit $51_1$. The circuit 52, the filter 53 and the comparator 54 corresponds to the control circuit 12 of FIG. 2.

As shown in the figure, a decision threshold level Vth is supplied to the amplifier $50_1$, and a decision threshold level Vth+dV is supplied to the amplifier $50_2$. After performing the XOR calculation on output pulses of the Hogge type phase comparators, the filter 53 calculates the average value. When the average value is less than or equal to $\Delta V$, the output $\phi 1$ of the phase comparator circuit $51_1$ is output. When the average value is greater than $\Delta V$, the output $\phi 1$ of the phase comparator circuit $51_1$ is held.

The Hogge type phase comparison circuit (IEEE Transactions on Electron Devices VOL. ED-32, No. 12 December 1985 "A Self Correcting Clock Recovery Circuit", Hogge, pp. 2704-2706) includes two D-FFs (D type flip-flop circuits) and two XORs. In the Hogge type phase comparison circuit, the D-FFs receive the data signal and the clock signal, and the Hogge type phase comparison circuit performs XOR on an output signal from the D-FFs and the data signal so as to output the result.

Figure 10:
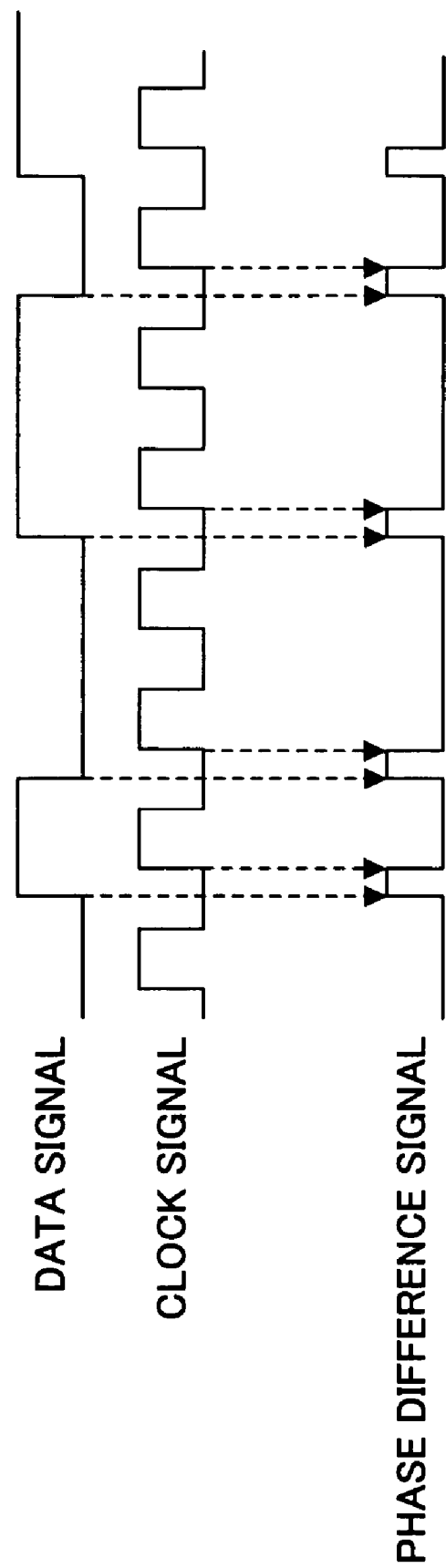
FIG. 10 is a figure showing characteristics of a Hogge type phase comparison circuit.

As shown in FIG. 10, the Hogge type phase comparison circuit has characteristics for outputting a pulse, as a phase difference signal, according to a delay time from a rising edge or a falling edge of the data signal to a rising edge of the clock signal.

An operation of the circuit of the fourth embodiment is described with reference to FIGS. 11A and 11B. FIG. 11A shows an example in a case where the rising edge of the data signal is steep, and FIG. 11B shows an example in a case where the rising edge of the data signal is gradual. Level changes at points indicated by numerals (1), (2), (3), in FIG. 9 are respectively indicated by the same numerals (1), (2), (3), ... in FIGS. 11A and 11B. The data signal and the clock signal are input as shown in (1) and (2) in FIGS. 11A and 11B. The amplifier 501 outputs a signal (3) that is obtained by identifying an edge of the data signal by using the decision threshold level Vth, and the amplifier $50_2$ outputs a signal (4) that is obtained by identifying an edge of the data signal by using the decision threshold level Vth+dth. The Hogge type phase comparison circuit $51_1$ compares the signal (3) with the clock signal (2) so as to output a signal (5). The Hogge type phase comparison circuit $51_2$ compares the signal (4) with the clock signal (2) so as to output a signal (6).

Then, by performing an XOR calculation on the signal (5) and the signal (6), a signal (7) that indicates a difference between the signal (5) and the signal (6) can be obtained. As to the signal (7), the longer the state of the High level is, the larger the difference between (5) and (6) is. In this embodiment, the filter 53 obtains an average, and the comparator 54 determines whether the average is greater than or less than or equal to a predetermined reference value $\Delta V$. To obtain the average is to obtain an average with respect to time in which the state of the High level is regarded as 1 and the state of the low level is regarded as 0, for example.

As shown in FIG. 11A, when the average value of (7) is less than or equal to $\Delta V$, the rising edge of the data signal is steep. In this example, since the effect of the noise in the amplitude direction is small, the sample-and-hold circuit 55 outputs a phase difference signal from the Hogge type phase comparator circuit 51.

The phase comparison circuit shown in FIG. 9 is an example that includes two pairs of amplifiers and Hogge type phase comparison circuits. Alternatively, a phase comparison circuit can be configured from the configuration of FIG. 6 such that each of phase comparison circuits $21_1 \sim 21_3$ shown in FIG. 6 is replaced by the Hogge type phase comparison circuit, and the circuit 22 is replaced by an XOR circuit and the filter.

Fifth Embodiment

The fifth embodiment is an embodiment of a clock recovery circuit that can perform phase control without causing cycle slip even when a large phase difference occurs. First, a principle of this embodiment is described.

As described in the related art, when a large phase difference that exceeds $\pm\pi$ between the data signal and the clock signal occurs, a cycle slip occurs in the conventional PLL circuit so that unlock occurs. These problems occur because the PLL circuit cannot determine whether the phase difference between the data signal and the clock signal is within 1 time slot as long as the data signal is treated as a random signal.

By the way, generally, in a data signal transmitted in a high-speed optical transmission system, data are arranged according to a predetermined frame structure. For maintaining synchronization in the receiving side, the frame structure includes a predetermined synchronization pattern. Therefore, in this embodiment, by detecting a phase difference between the pattern included in the data signal and a pattern generated in synchronization with an extracted clock signal, a phase difference that exceeds 1 time slot is detected, and phase control of the clock signal is performed according to the phase difference.

Figure 12:
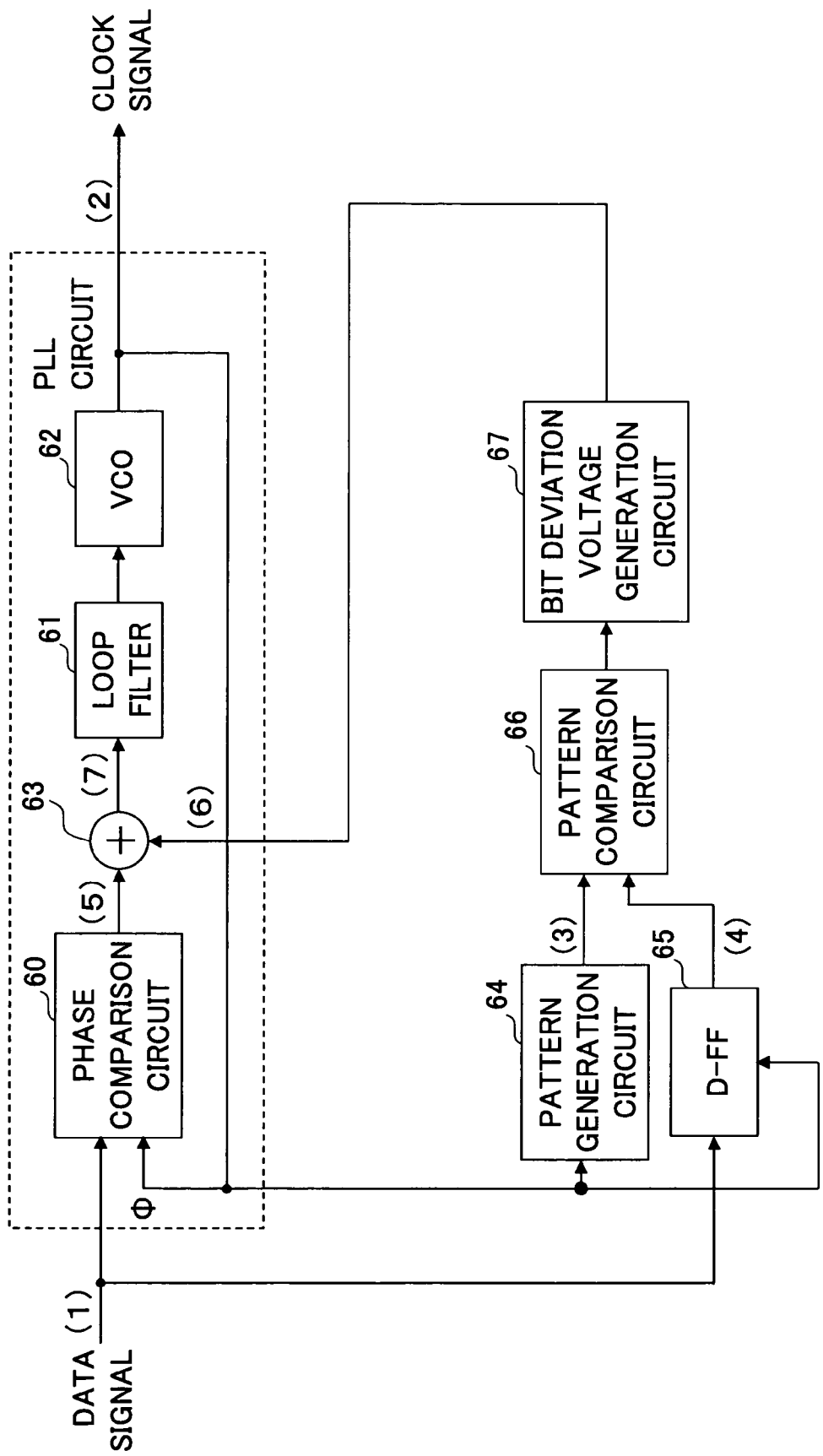
FIG. 12 is a block diagram of a clock recovery circuit in a fifth embodiment.

FIG. 12 shows a clock recovery circuit in the fifth embodiment. As shown in FIG. 12, the clock recovery circuit includes a part of a PLL circuit and a part for performing pattern comparison to output a bit deviation voltage. The PLL circuit part includes a phase comparison circuit 60, a loop filter 61, a VCO 62, and an adder 63 for adding a below-mentioned bit deviation voltage to an output signal of the phase comparison circuit 60.

The part for performing pattern comparison to output the bit deviation voltage includes a pattern generation circuit 64 for outputting a pattern in synchronization with the clock signal, a D type flip-flop circuit (D-FF 65) for outputting the pattern of the data signal, a pattern comparison circuit 66 for comparing the patterns, and a bit deviation voltage generation circuit 67 for outputting the bit deviation voltage according to phase differences.

The operation of the clock recovery circuit is described with reference to a timing chart of FIGS. 13A and 13B and FIG. 14. In FIGS. 13A and 13B, FIG. 13A shows a case where a phase difference φ between the data signal and the clock signal is less than π, and FIG. 13B shows a case where a phase difference φ between the data signal and the clock signal is greater than π. Level changes of signals at points indicated as (1), (2), (3) and (4) in FIG. 12 are respectively shown as the same numbers (1), (2), (3) and (4) in FIGS. 13A and 13B. In FIG. 14, (5) indicates output characteristics of the phase comparison circuit 60, (6) indicates a voltage, corresponding to the phase difference of (5), generated by the bit deviation voltage generation circuit 67, and (7) indicates a voltage obtained by adding an output voltage of the phase comparison circuit 60 and a voltage generated by the bit deviation voltage generation circuit 67.

The phase comparison circuit 60 receives the data signal (1) and the clock signal (2), and outputs the voltage signal (5) according to the phase difference φ. The pattern generation circuit 64 outputs the pattern (3) (indicated as "1001" in FIGS. 13A and 13B as an example) synchronized with the clock signal (2). In addition, the D-FF 65 outputs the pattern (4) of the data signal synchronized with the clock signal while allowing bit deviation wherein a bit is a transmitting information unit. In the case of FIG. 13A, there is no bit deviation of the pattern of the data signal.

In the case of FIG. 13B, a bit deviation occurs. That is, (3) is delayed by 1 bit with respect to (4). The operation described in the following is for the case of FIG. 13B.

The bit deviation voltage generation circuit 67 generates a voltage 2 V shown in (6) corresponding to the 1 bit deviation. The voltage is added to the phase difference signal (5) by the adder 63, so that a signal (7) corresponding to an actual phase difference is generated. For example, if the phase difference is 1.5π, a voltage Xv shown as the phase difference signal (7) in FIG. 14 is added to the loop filter 61. Then, according to the phase difference signal, the frequency of the VCO 62 is controlled so that the phase of the clock signal is controlled.

That is, when the phase difference exceeds 1 time slot, an offset according to a direction in which the phase is deviated is added to the phase difference signal so that a controllable phase range in which a phase can be changed to an optimum phase can be enlarged. FIG. 14 shows an example in which the phase can be changed to the optimum phase when the phase difference is within 3 time slots.

By adopting the above-mentioned configuration, a clock recovery circuit resistant to unlock can be obtained.

As for the phase comparison circuit 60 shown in FIG. 12, although a conventional one can be used, by using the phase comparison circuit described in the first to fourth embodiments, a clock recovery circuit resistant to unlock in which the effect of the noise in the amplitude direction is small can be provided.

Sixth Embodiment

Figure 15:
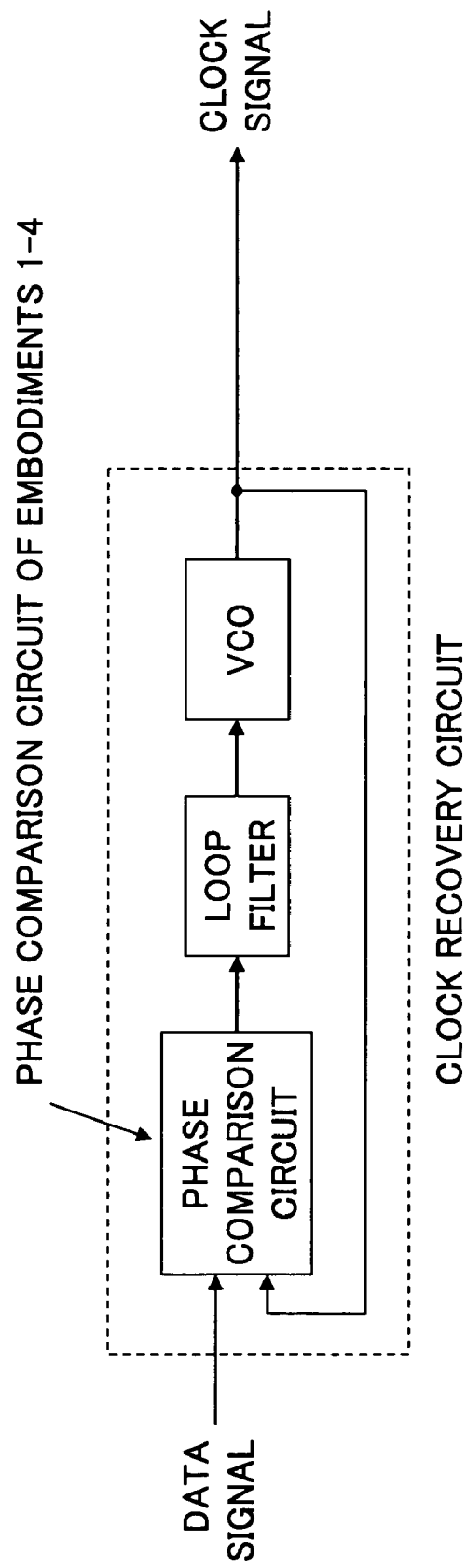
FIG. 15 shows an example of a clock recovery circuit to which the phase comparison circuit of the embodiment of the present invention is applied.

By adopting the phase comparison circuit described in the first to fourth embodiments to a PLL circuit having a conventional structure shown in FIG. 15, a clock recovery circuit reducing the effect of the noise in the amplitude direction can be realized. The configuration shown in FIG. 1 that uses the above-mentioned clock recovery circuit or the clock recovery circuit in the fifth embodiment and a decision circuit can be used as an optical receiving circuit in an optical receiving apparatus in an optical communication system.

Figure 16:
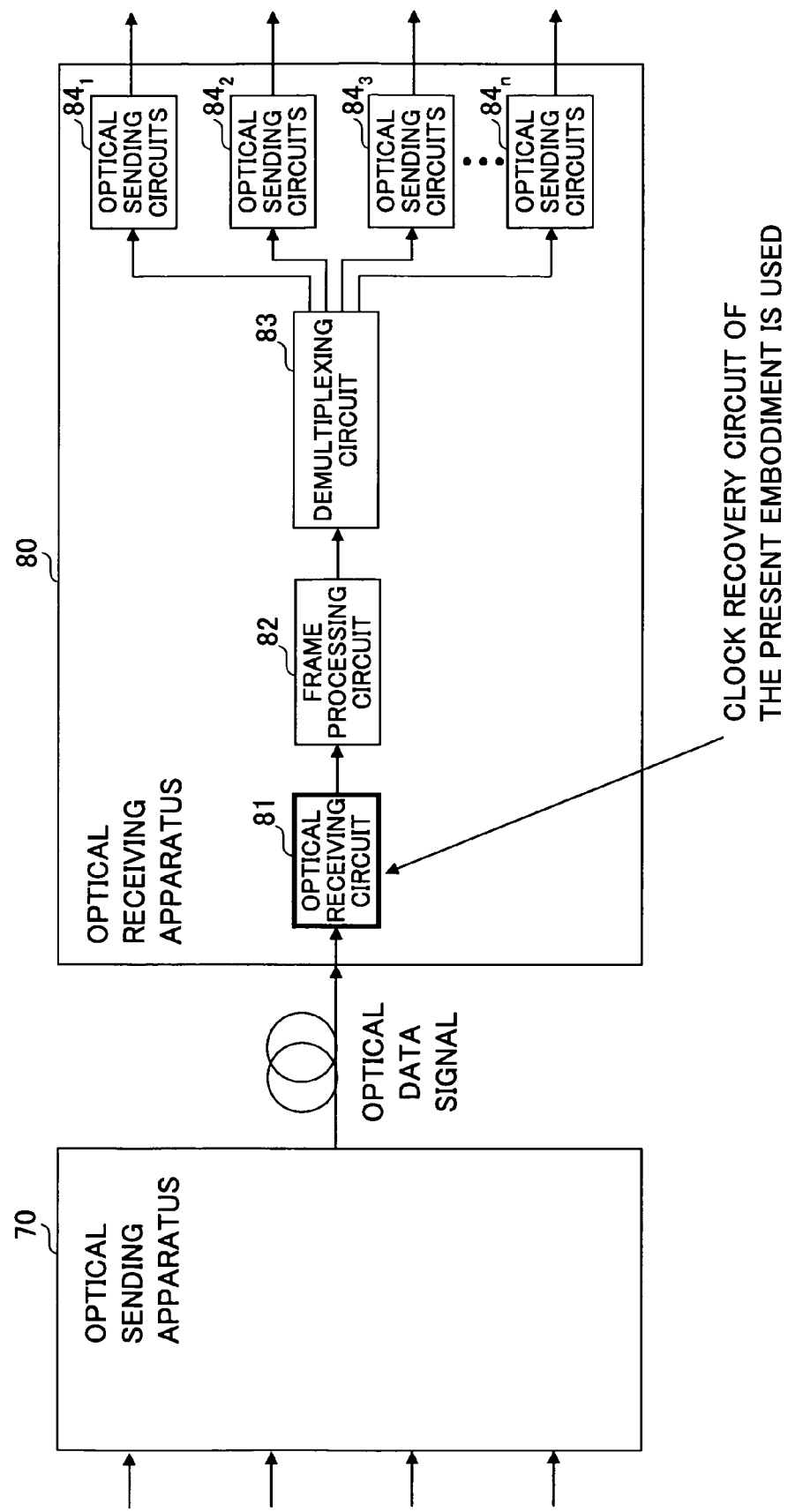
FIG. 16 is a block diagram of an entire optical communication system including an optical receiving circuit in which the phase comparison circuit or the clock recovery circuit of the embodiments of the present invention.

FIG. 16 shows a configuration example of the sixth embodiment.

The optical communication system includes an optical sending apparatus 70 and an optical receiving apparatus 80. The optical receiving apparatus 80 includes the above-mentioned optical receiving circuit 81, a frame processing circuit 82 for performing frame processing for optical signals, a demultiplexing circuit 83 for demultiplexing wavelengths of light, and plural optical sending circuits $84_1 \sim 84_n$.

Since the optical receiving circuit 81 includes the clock recovery circuit of the present invention and a decision circuit, the optical receiving circuit 81 can regenerate a clock signal without unlock and without excessively increasing bit errors.

As described in each of the above-mentioned embodiments, according to the present invention, the phase comparison circuit does not output a phase difference signal when the effect of the noise in the amplitude direction is large, and outputs a phase difference signal only when the effect of the noise is small. By using such a phase comparison circuit, a clock recovery circuit that can remove the effect of the noise can be realized. In addition, even when a large phase difference that exceeds ±π occurs, the clock recovery circuit can recognize the phase difference and operate to correct the phase difference.

In addition, by using the above-mentioned clock recovery circuit, an optical receiving circuit that can stably extract a clock signal even under a condition of bad SN ratio of the input data signal can be realized. Further, by using the optical receiving circuit, a high-speed optical transmission system of high performance that uses error correcting code can be realized so that transmission distance and transmission speed can be improved.

The present invention is not limited to the specifically disclosed embodiments, and variations and modifications may be made without departing from the scope of the invention.

What is claimed is:

1. A phase comparison circuit for outputting a phase difference signal indicating a phase difference between a data signal and a clock signal, the phase comparison circuit comprising:

a detection part configured to output a plurality of signals indicating phases of the data signal according to different decision threshold levels;

a phase comparison part configured to output phase difference signals each indicating a phase difference between a signal in the plurality of signals output from the detection part and the clock signal; and a control part configured to determine whether to output a particular phase difference signal amongst the phase difference signals by using the whole or a part of the phase difference signals, wherein the detection part detects, for each decision threshold level, a phase of the data signal at a time when a rising level or a falling level of the data signal reaches the decision threshold level.

2. The phase comparison circuit as claimed in claim 1, wherein the control part determines a rising or falling time of the data signal by using the whole or the part of the phase difference signals output from the phase comparison part, and controls the phase comparison circuit to output the particular phase difference signal when the rising or falling time is smaller than a specified value.

3. The phase comparison circuit as claimed in claim 1, wherein the detection part includes three detection circuits, and the phase comparison part includes three individual phase comparison circuits, and the control part controls the phase comparison circuit so as to output the particular phase difference signal output from an individual phase comparison circuit among the three individual phase comparison circuits when a difference between two phase difference signals output from two individual phase comparison circuits among the three individual phase comparison circuits is smaller than a specified value.

4. The phase comparison circuit as claimed in claim 1, wherein the detection part includes three detection circuits, and the phase comparison part includes three individual phase comparison circuits, each including a D type flip-flop circuit, and calculates an exclusive-OR between an output signal from the D type flip-flop circuit and the data signal, and the control part controls the phase comparison circuit so as to output the particular phase difference signal output from an individual phase comparison circuit among the three individual phase comparison circuits when an average value of an exclusive-OR of two phase difference signals output from two individual phase comparison circuits among the three individual phase comparison circuits is no more than a specified value.

5. The phase comparison circuit as claimed in claim 1, wherein:

the detection part includes two detection circuits, the phase comparison part includes two individual phase comparison circuits, and the control part controls the phase comparison circuit so as to output the particular phase difference signal output from an individual phase comparison circuit between the two individual phase comparison circuits when a difference between two phase difference signals output from the two individual phase comparison circuits is smaller than a specified value.

6. The phase comparison circuit as claimed in claim 1, wherein:

the detection part includes two detection circuits, the phase comparison part includes two individual phase comparison circuits, each including a D type flip-flop circuit, and calculates an exclusive-OR between an output signal from the D type flip-flop circuit and the data signal, and the control part controls the phase comparison circuit so as to output the particular phase difference signal output from an individual phase comparison circuit between the two individual phase comparison circuits when an average value of an exclusive-OR of two phase difference signals output from the two individual phase comparison circuits is no more than a specified value.

7. The phase comparison circuit as claimed in claim 1, wherein:

the detection part includes two detection circuits, the phase comparison part includes two individual phase comparison circuits, and a circuit configured to change a decision threshold level of a detection circuit between the two detection circuits by using a periodically changing signal, and the control part controls the phase comparison circuit so as to output the particular phase difference signal output from an individual phase comparison circuit between the two individual phase comparison circuits when a changing range of a phase difference signal output from the individual phase comparison circuit that receives a signal output from the detection circuit whose decision threshold level changes is no more than a specified value.

8. A clock recovery circuit that forms a PLL circuit including a phase comparison circuit, a filter and a voltage control oscillation circuit, the phase comparison circuit comprising:

a detection part configured to output a plurality of signals indicating phases of a data signal according to different decision threshold levels;

a phase comparison part configured to output phase difference signals each indicating a phase difference between a signal in the plurality of signals output from the detection part and the clock signal; and a control part configured to determine whether to output a particular phase difference signal amongst the phase difference signals by using the whole or a part of the phase difference signals, wherein the detection part detects, for each decision threshold level, a phase of the data signal at a time when a rising level or a falling level of the data signal reaches the decision threshold level.

9. The clock recovery circuit as claimed in claim 8, wherein the control part determines a rising or falling time of the data signal by using the whole or the part of the phase difference signals output from the phase comparison part, and controls the phase comparison circuit to output the phase difference signal when the rising or falling time is smaller than a specified value.

* * * * *